United States Patent [19]

Faust

[11] 3,708,732

[45] Jan. 2, 1973

[54] COMPOUND ELECTRICAL CIRCUIT UNIT COMPRISING A MAIN POWER TYPE THYRISTOR AND AUXILIARY CONTROL SEMICONDUCTOR ELEMENTS STRUCTURALLY AND ELECTRICALLY UNITED TO FORM A COMPACT ASSEMBLY

[75] Inventor: Werner Faust, Wettingen, Switzerland

[73] Assignee: Aktiengesellschaft Brown, Boveri & Cie, Baden, Switzerland

[22] Filed: Nov. 10, 1970

[21] Appl. No.: 88,468

Related U.S. Application Data

[63] Continuation of Ser. No. 721,298, April 15, 1968, abandoned.

[30] Foreign Application Priority Data

Aug. 3, 1967 Switzerland ........................10980/67

[52] U.S. Cl.......317/235 R, 317/235 N, 317/235 AB, 317/235 D, 317/234 G

[51] Int. Cl. ............................................... H01l 15/00

[58] Field of Search.317/22, 41.1, 27, 234 G, 235 N, 317/235 AB, 235 D

[56] References Cited

UNITED STATES PATENTS

| | | | |
|---|---|---|---|
| 3,489,962 | 1/1970 | McIntyre et al. | 317/235 |
| 3,505,527 | 4/1970 | Sland | 250/214 |
| 3,440,501 | 4/1969 | Piccone et al. | 317/235 |
| 3,566,211 | 2/1971 | Svedberg | 317/235 |

OTHER PUBLICATIONS

E. Keith Howell, "Light-actuated Switch." Electronics, May 4, 1964, Vol. 37, No. 15, p. 53.

*Primary Examiner*—Martin H. Edlow
*Attorney*—Pierce, Scheffler & Parker

[57] ABSTRACT

A compound electrical circuit unit comprises a main, high power type thyristor and auxiliary low power control semiconductor elements structurally and electrically united to form a compact assembly which is enclosed within a housing. At least some of the auxiliary semiconductor elements such as low power thyristors are established directly on the disc of semiconductor material which forms the main power thyristor, and light responsive elements, such as light sensitive thyristors, are connected to, and control the auxiliary thyristors, the light-sensitive thyristors being exposed to light through a window in the housing.

4 Claims, 5 Drawing Figures

PATENTED JAN 2 1973 3,708,732

INVENTOR.
Werner Faust
BY
Prince, Scheffler & Parker
Attorneys

COMPOUND ELECTRICAL CIRCUIT UNIT COMPRISING A MAIN POWER TYPE THYRISTOR AND AUXILIARY CONTROL SEMICONDUCTOR ELEMENTS STRUCTURALLY AND ELECTRICALLY UNITED TO FORM A COMPACT ASSEMBLY

This application is a continuation of U.S. Pat. application Ser. No. 721,298, filed Apr. 15, 1963, now abandoned.

The present invention relates to a compound electrical circuit having a plurality of semiconductor elements, which are structurally and electrically unitized in order to form a more compact assembly. In such a circuit, each semiconductor element is, as a rule, made separately. The circuit consists of a plurality of silicon discs having differing electrical properties. In the case of a thyristor there are, for example, four layers having a p-n-p-n characteristic. Each semiconductor is made separately and all are then connected together to form a circuit. A plurality of such elements have indeed already been assembled, forming so-called "stacks" which have a common frame or base on which the individual semiconductors themselves are assembled. Discs carrying the same potential are then joined to one another electrically, and assembled in this way. It is also possible for parallel-connected diodes and thyristors to be connected together in a housing, and for all the elements to be placed on a base-plate.

Such arrangements are, however, wasteful of space, especially in the case of a high power type thyristor which handles relatively heavy currents and which is controlled by auxiliary low powered semiconductor elements such as low-powered thyristors, conventional diodes and photo-sensitive diodes and resistances, etc. It is therefore proposed according to the invention that at least some of the auxiliary semiconductor elements of the compound circuit be assembled on a common disc of semiconductor material which forms part of the semiconductor elements. The use of such a common disc of semiconductor material makes possible a considerable reduction in space in the case of parallel circuits. It reduces the thickness of the arrangement in the case of diodes connected in series-opposition. In the case of light-controlled semiconductor elements, the close arrangement of such parts allows of simultaneous action by a single concentrated light-beam. In the accompanying drawings:

Figure 1:
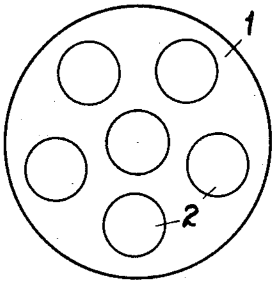
FIG. 1 shows an example of the invention for a plurality of parallel rectifier elements.

With reference now to FIG. 1, this shows the fundamental arrangement in which a silicon disc 1 has built on to it a plurality of further disc 2 that establish various types of auxiliary diodes, thyristors and photodiodes. The connections are not illustrated, since they may be fastened in known manner. The only condition for this is that the auxiliary semiconductor elements assembled together on the on the supporting semiconductor disc must be at the same potential.

Figure 2:
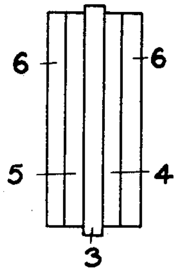
FIG. 2 shows an example for diodes connected in series-opposition.

Auxiliary diodes or thyristors connected in series-opposition are illustrated in FIG. 2. These are at the same potential at the point of contact. Hence, a semiconductor disc 3 may be common to both diodes 4 and 5. 6 illustrates cover-plates made, for example, of molybdenum.

Figure 3:
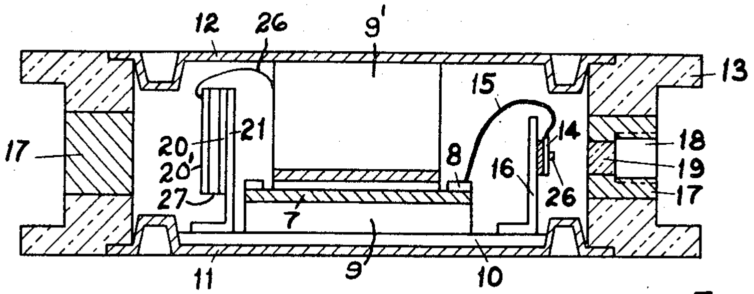
FIG. 3 is a view in central vertical section showing an assembly, in a single housing, of a plurality of semiconductor elements built up on one slice.
Figure 4:
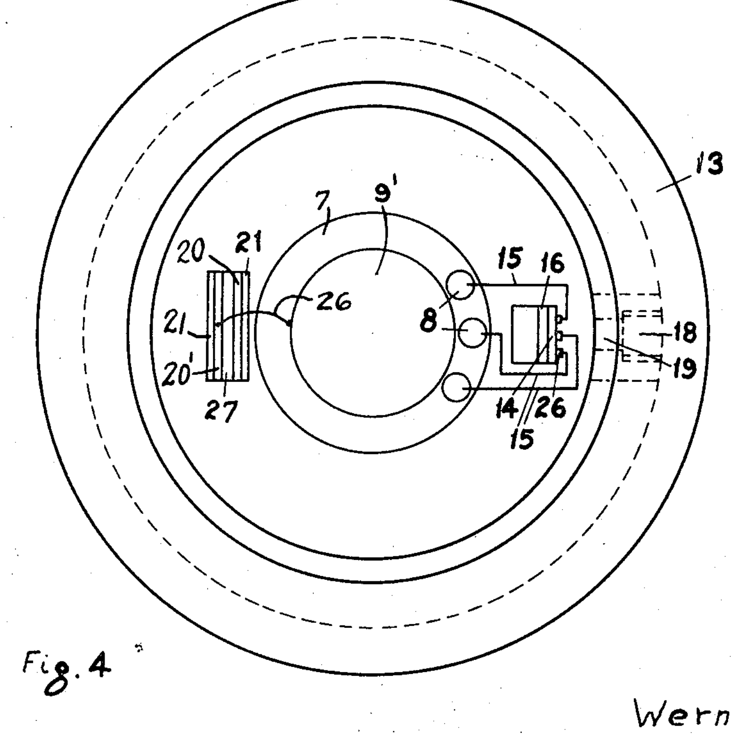
FIG. 4 is a top plan view of the structural arrangement illustrated in FIG. 3.

FIG. 3 shows a structural embodiment of a power-type semiconductor layout assembled with a plurality of auxiliary semiconductor elements such as photodiodes, thyristors and further diodes. The composite structural assembly includes three silicon discs 7, 14 and 20 each having a plurality of semiconductor elements built onto them. Silicon disc 7 functions as a power thyristor and supports on its upper side three auxiliary thyristors 8 placed around the edge portion thereof. A disc 9 made of molybdenum supports the silicon disc 70 of the main, power thyristor, and the molybedenum disc 9 is supported on a base 10. The latter is carried by a bottom circular end plate 11 of the housing which encloses all of the semiconductor elements. A corresponding circular end plate 12 of the housing is provided at the top. The end plates 11 and 12 are held within a ceramic ring 13. A cylindrical member 9' is lodged between the underside of the top end plate 12 and the main, power thyristor 7 for securing the latter in its position and for removal of heat generated by this thyristor during its operation. The auxiliary, low-powered thyristors 8 are light-controlled. For this purpose there are light-sensitive auxiliary thyristors 26 built onto the semiconductor disc 14 and joined electrically by the leads 15 to the thyristors 8. The auxiliary thyristors 26 may be better recognized in the plan view, three being illustrated by way of example, and they control respectively and simultaneously the three thyristors 8 shown. They are supported by an angle piece 16 upstanding on base 10. For light-control purposes, the ceramic ring 13 has inserted into it a metal cylinder 17 which includes apertures 18 through which the light can pass. These apertures are provided with a glass window 19.

Diodes 20, 20' connected in series-opposition are furthermore illustrated, diodes are structured in the manner depicted in detail in FIG. 2 in that both diodes are formed on opposite faces of a common semiconductor disc 27. The dual diode assembly 20, 27, 20' is carried by the angle piece 21 upstanding on base 10. A conductor 26 electrically connects the anode side of diode 20' to the cylindrical part 9' and hence also to the anode side of the main, power thyristor 7. Similarly, the angle piece 21 electrically connects the anode side of the other diode 20 to the cathode side of the power thyristor 7 through the base 10 and disc 9, thus placing these two diodes in parallel with the power thyristor 7, which from an electrical standpoint is a conventional arrangement.

Figure 5:
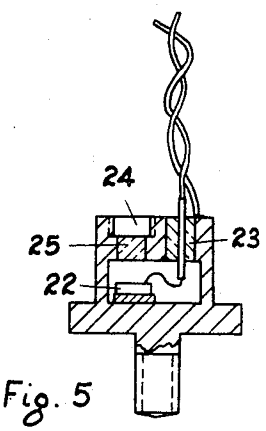
FIG. 5 finally shows an arrangement for light-sensitive thyristors.

FIG. 5 shows a special housing in which there are semiconductor discs with a plurality of thyristors or photo-sensitive diodes. The semiconductor discs on which the various elements are placed is here designated by 22. The leads are passed in through a ceramic bushing 23. An aperture 24 provided with a glass window 25 ensures that light is conveyed to the light-sensitive elements, which may also include photoresistances.

I claim:

1. An encapsulated power thyristor assembly which comprises a main high power thyristor constituted from a silicon disc carried by an underlying support plate which is both electrically and heat conductive, a housing enclosing said power thyristor, said housing including end plates which are both electrically and heat conductive, said plates being spaced from each other by a wall of electrically insulating material which surrounds said power thyristor, one of said end plates being in electrical and heat transfer contact with said underlying support plate for the silicon disc and the other end plate being in contact with said silicon disc through an intermediate electrical and heat conductive member having a smaller diameter than said silicon disc, at least one auxiliary low power thyristor connected in circuit with and controlling the ignition of said power thyristor and which is secured in place on the upper surface of said silicon disc outwardly from said intermediate conductive member and thus outwardly from the main path of the heat flow through said power thyristor, a light sensitive device mounted within said housing and which is connected to said auxiliary thyristor for controlling the ignition thereof which in turn controls the ignition of said power thyristor, and means providing a window into said housing for admitting light to said light sensitive device.

2. An encapsulated power thyristor assembly as defined in claim 1 wherein said light sensitive device is constituted by a light sensitive thyristor.

3. An encapsulated power thyristor assembly as defined in claim 1 and which includes a plurality of said auxiliary thyristors secured in place on the upper surface of said silicon disc outwardly from said intermediate conductive member and which are connected electrically in parallel.

4. An encapsulated lower thyristor assembly as defined in claim 1 and which further includes a pair of diodes supported within said housing, said diodes being connected together in series opposition and electrically in parallel with said power thyristor.

* * * * *